United States Patent [19]

Abolafia et al.

[11] 3,795,047

[45] Mar. 5, 1974

[54] ELECTRICAL INTERCONNECT STRUCTURING FOR LAMINATE ASSEMBLIES AND FABRICATING METHODS THEREFOR

[75] Inventors: Oscar R. Abolafia, Endicott; John A. Lau, Johnson City; Franklin F. M. Lee, Endwell; Catherine R. Watson, Binghamton, all of N.Y.

[73] Assignee: International Business Machines Corporation, Armonk, N.Y.

[22] Filed: June 15, 1972

[21] Appl. No.: 263,089

[52] U.S. Cl. .................... 29/625, 156/275, 156/276, 156/330, 174/68.5

[51] Int. Cl. .................... H05k 3/36

[58] Field of Search .... 174/68.5; 317/261, 101 CM; 29/62 S, 576, 577; 156/49, 275, 276, 277, 330, 163, 181, 290, 291; 117/201, 212, 213, 218

[56] References Cited

UNITED STATES PATENTS

| | | | |
|---|---|---|---|
| 3,148,310 | 9/1964 | Feldman | 29/625 X |
| 3,193,789 | 7/1965 | Brown | 174/68.5 X |
| 3,541,222 | 11/1970 | Parks et al. | 29/625 X |
| 3,509,270 | 4/1970 | Dube et al. | 29/625 X |
| 3,606,677 | 9/1971 | Ryan | 156/330 X |
| 3,646,670 | 3/1972 | Maeda et al. | 29/628 X |

*Primary Examiner*—Charles W. Lanham
*Assistant Examiner*—Joseph A. Walkowski
*Attorney, Agent, or Firm*—Charles S. Neave

[57] ABSTRACT

This is a structuring technique for fabricating a multilayer circuit assembly by laminating subassemblies and joining the conductive elements from one subassembly to another both electrically and mechanically by application of a metal powder epoxy (MPE) process at each joint interface. Adjacent conductive surfaces are interconnected by first applying a thin layer of B-stage epoxy to the circuit areas of one conductive surface. Uniformly spherical metal particulate powder is then sprinkled over the entire surface. After moderate heating the powder particulate will remain only on the epoxied areas. The other surface is uniformly covered with B-stage epoxy. The two surfaces so pretreated are then laminated together in an alignment fixture under both pressure and heat. The metal particles, which are spherical and equal sized, and harder than both of the conductive surfaces, are able to penetrate the epoxy layers and into contact with the metallic conductive surfaces during the heating and pressure process. The epoxy is cured with a resultant interconnection that is electrically good and mechanically strong.

11 Claims, 7 Drawing Figures

ELECTRICAL INTERCONNECT STRUCTURING FOR LAMINATE ASSEMBLIES AND FABRICATING METHODS THEREFOR

BACKGROUND OF THE INVENTION

1. Field of the Invention

This invention relates to the novel structuring of a high packaging density multilayer circuit board and the fabricating methods therefor, and more particularly, to a circuit board having good electrical characteristics, good mechanical strength, and high aspect ratio capability.

2. Description of the Prior Art

The present day trend in the electronics industry is to microminiaturization which have resulted in a variety of printed circuit packaging schemes to provide more compact printed circuit assemblies. Frequently, the circuit densities are increased and it is desirable to decrease the circuit length. The printed circuit card is reduced in size and several cards are assembled in stacked or superimposed relationship. Consequently, the reduction of size of the circuit card results in an increased density of the interconnecting points. Thus, the major factors limiting the degree of miniaturization which may be achieved by the stacking of printed circuit cards are the means and methods used to electrically interconnect the cards.

For example, U. S. Pat. No. 3,371,249 provides a multilayer printed circuit assembly utilizing a solder method for electrically and mechanically interconnecting the stacked printed circuit cards. The U. S. Pat. No. 3,541,222 discloses a connector screen for interconnecting the electrodes upon the opposed faces of two adjacent circuit boards and to the method of making such a connector screen. The U. S. Pat. No. 3,606,677 teaches the lamination of two or more circuit boards utilizing a controlled flow adhesive layer with the controlled flow adhesive permitting the through holes to remain obstructed after lamination. The final interconnection is made by plating through the holes to provide the requisite electrical interconnections between the surfaces. U. S. Pat. No. 3,148,310 relates to methods for electrically and mechanically interconnecting the thin film elements of circuit boards by an application of sphere devices which are fused to the substrates by heating Technical difficulties for reducing the diameter of the interconnecting holes between the circuit layers are encountered by the inability to accurately drill relatively thick multilayer circuit assemblies. Further, there are limitations on the smallness of hole sizes where the through holes are plated after the lamination of a stack of subassemblies.

SUMMARY OF THE INVENTION

This invention is directed to the provision of a novel structure and unique method of fabricating the high density multilayer circuit board package and to the electrical interconnecting means for the conductive elements located upon the opposing surfaces of adjacent laminate subassemblies.

Laminate layers of dielectric material having conductive circuit patterns adhesively bonded to one or both planar surfaces can be electrically interconnected to adjacent laminate layers by sandwiching between them a single layer of uniformly spherical sized metal powder particulate and then filling the voids among them with epoxy. This single layer of highly conductive metal powder can be selectively deposited and secured at the areas where electrical joints are desired. A thin layer of epoxy at B-stage is applied to the selected areas of one surface in order to hold the metal powder particulate which is subsequently sprinkled over the entire surface. After a moderate heating, the metal powder particulate will stay on the areas where the epoxy is located. The contacting surface of the adjacent laminate is covered uniformly with a thin layer of epoxy at B-stage and in accordance with the thickness of the metal powder particulate. The two adjacent surfaces so pretreated are then laminated together in an alignment fixture under an application of both pressure and heat. The metal particles which are spherical and equally sized, and usually harder than the conductive circuit surfaces attached to the laminate subassemblies, are able to penetrate the epoxy layers and into contact with the metallic circuit surfaces during the heating and pressure process. The epoxy is cured and the metal particles then remain in good contact, functioning as spacers as well as electrical current carriers. This structuring provides joining which has both high electrical conductivity and good mechanical strength at the joints so formed.

Accordingly, it is a principal object of the present invention to provide a method for electrically and mechanically interconnecting laminate subassemblies to create a multilayer printed circuit assembly.

It is another object to provide a method for electrically and mechanically interconnecting a plurality of closely spaced and superimposed printed circuit cards or the like by means of a metal powder epoxy material.

It is a further object of the invention to provide an improved method for electrically interconnecting circuit elements upon the opposed surfaces of adjacent printed circuit cards.

It is another object of the invention to provide a unique electrical interconnecting system enabling the high density packaging of multilayer circuit cards and having high aspect ratio capabilities.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Referring to FIGS. 1, 2, 6 and 7, a laminate subassembly 1 is shown which includes the dielectric layers 2*a* and 2*b*. The dielectric layers 2*a* and 2*b* may have metallic layers 3*a* and 3*b* attached thereto. The laminate joint interface consists of a layer of B-stage epoxy 4 having a plurality of metal powder particulate 5 interspersed therein. The laminate subassembly is formed by aligning the dielectric layers 2*a* and 2*b* with the metallic layers 3*a* and 3*b* in opposing relationship and then applying heat and pressure. The joint interface is permitted to cure, usually while the pressure remains applied but the heat is removed. Both the heat and pressure are determined by the characteristics of the epoxy chosen to form the interface joining and also by the relative hardness of the metal powder particulate and the metallic layers 3*a* and 3*b*.

The choice of materials for the laminate subassembly should be dependent upon the type of application. For example, if a joint interface can be suitably formed without appreciable heating, then an epoxy having low temperature cure characteristics may be used. Further, a thermoplastic material may be used if the interface joint will not be exposed to a high temperature environment.

Figure 1:
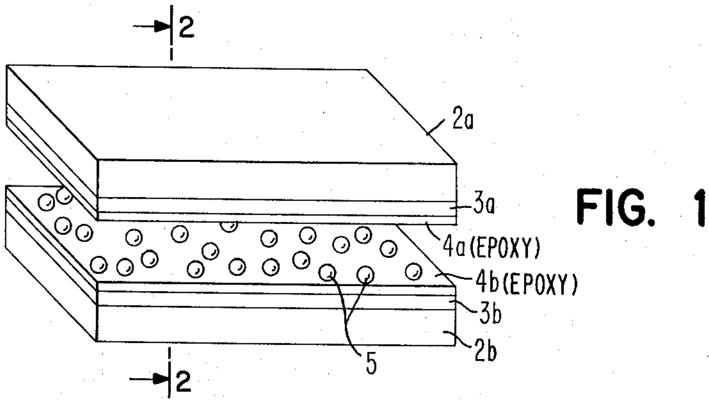
FIG. 1 is an isometric view of a laminate subassembly before joining and according to the present invention.
Figure 2:
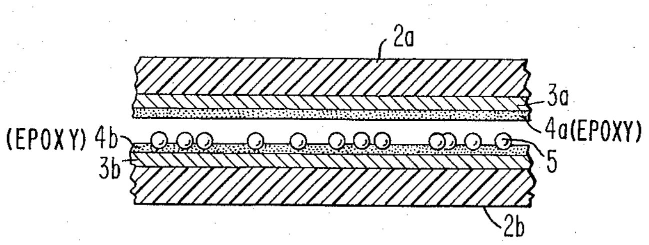
FIG. 2 is a partial cross sectional view of the laminate subassembly as shown in FIG. 1.
Figure 6:
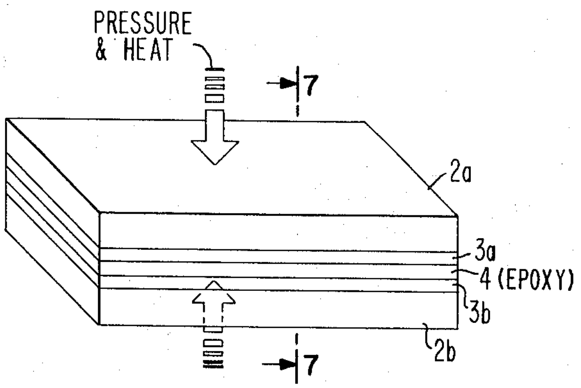
FIG. 6 is an isometric view of a laminate subassembly after joining under pressure and heat and according to the present invention.
Figure 7:
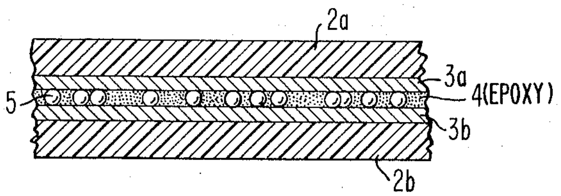
FIG. 7 is a partial cross-sectional view of the laminate subassembly as shown in FIG. 6.
Figure 3:
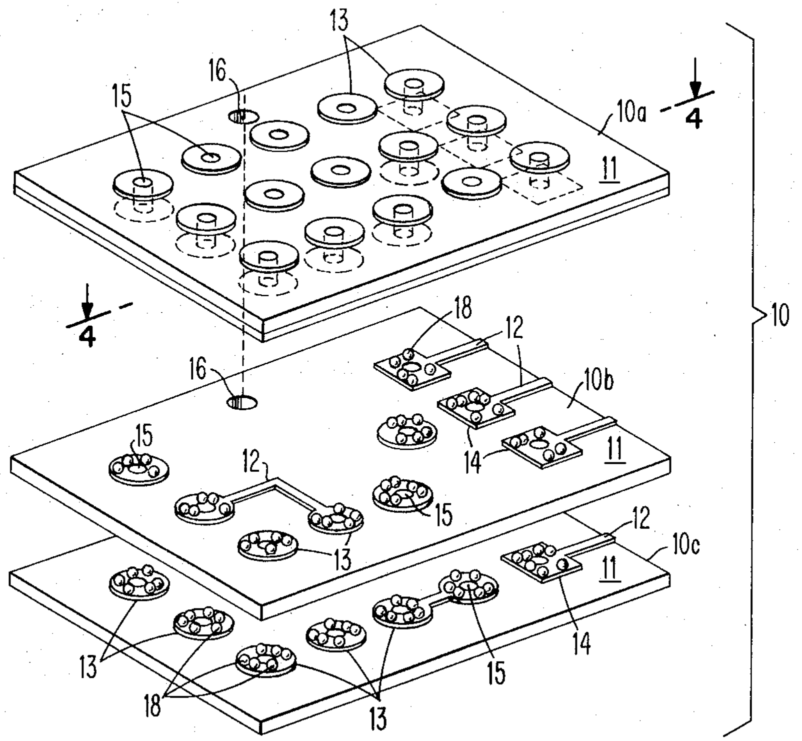
FIG. 3 is an exploded view of a multilayer printed circuit card assembly according to the present invention.

Referring to FIG. 3, there is shown an exploded view of a multilayer printed circuit card assembly 10 which includes a plurality of printed circuit cards 10*a*, 10*b* and 10*c*. Each printed circuit card 10*a*, 10*b* and 10*c* has a base of dielectric material 11. The desired configuration of printed circuit electrically conductive elements comprising conductive strips 12, circular connecting areas 13 and the square connecting pads 14 may be affixed to one or both sides of the dielectric material 11. Apertures 15 in the order of 0.010 inch or less are drilled into the printed circuit card layers 10*a*, 10*b* and 10*c*. The apertures 15 are then metallically through plated to electrically interconnect the opposed pairs of circular areas 13. In the preferred embodiment, the working area of the printed circuit cards 10*a* etc. utilized connecting areas 13 having 0.020 inch diameter at 0.100 inch grid spacing. Each printed circuit card assembly 10*a*, 10*b* and 10*c* has an overall thickness in the order of 0.020 inch. No limitation is intended by the mentioning of these dimensions. Other suitable combinations of aperture diameters, grid spacing and card thickness can be effectively utilized. The fabrication of the electrically conductive areas and conductive lines on the printed circuit card may be accomplished by any of various conventional ways.

The philosophy of the present invention is to provide a technology for producing a high circuit density printed circuit board 10 by laminating several layers of printed card subassemblies 10*a*, 10*b* and 10*c* after each subassembly has been hole drilled and plated through, so that the plated through holes in the order of approximately 0.010 inch or smaller and on a grid spacing of 0.100 inch or smaller, and having a high aspect ratio may be suitably combined to form a printed circuit board 10. The aspect ratio will hereinafter be explained in greater detail.

Figure 4:
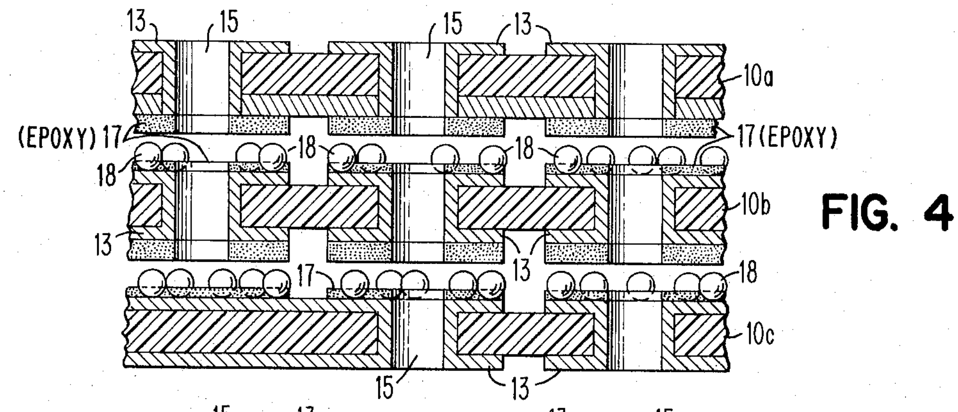
FIG. 4 is a partial cross-sectional view showing the prejoined interlayer connecting structure.
Figure 5:
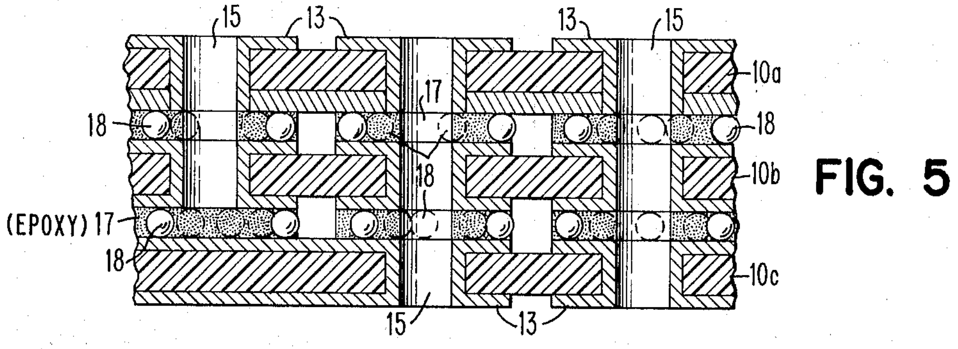
FIG. 5 is a partial cross-sectional view showing a joined interlayer connection structuring according to the present invention.

Referring to FIGS. 4 and 5, there is shown partial cross-sectional views to illustrate the joining of a plurality of stacked printed circuit card assemblies 10*a*, 10*b* and 10*c* by a metal powder epoxy technology. Three printed circuit card laminate assemblies 10*a*, 10*b* and 10*c* have been shown exemplifying the joining embodiment, while many more printed circuit cards 10 can be simultaneously joined by the metal powder epoxy technology of the present invention.

The printed circuit card laminate assemblies 10*a*, 10*b* and 10*c* are substantially identical with the exception that the different subassemblies may exhibit a different conductive pattern. The plated through-hole pattern is generally the same for each printed circuit card layer, and the subassemblies are superimposed with the through-holes of each laminar layer in registration with the through-holes of the adjacent card subassemblies. A multilayer printed circuit card assembly 10 can be aligned by means of the aligning holes 16 in each of the printed circuit cards 10*a*, 10*b* and 10*c*, by an aligning fixture, or other appropriate aligning device (not shown).

The joining is accomplished by first aligning the printed circuit cards 10*b* and 10*c* face with a mask (not shown) having openings at the signal connecting areas 13. A thin layer of epoxy 17, approximately 0.0002 inch thick, is deposited into the open areas of the mask. The mask is then removed from the printed circuit card assemblies 10*b* and 10*c*. A metal powder particulate containing particles 18 of uniform size and of spherical shape is then sprinkled over the entire printed circuit card 10 surface. The printed circuit card subassemblies 10*a* and 10*b* are then moderately heated to the epoxy gel point, usually in a range of 180° to 250° F. The excessive powder is then removed preferably by air or brush means. A thin layer of epoxy is then uniformly deposited over the entire opposing surfaces of the printed circuit card subassemblies 10*a* and 10*b* which is then cured to "B-stage." "B-stage" is a partial cure wherein the epoxy has a somewhat soft and sticky characteristic and ideally suited to retain the metal powder particulate.

The printed circuit card 10 subassemblies are then aligned in an aligning fixture and the laminate multilayer assembly is joined with a conventional press at an epoxy curing temperature, usually in a range of 200° to 360° F. and under a pressure of 100 to 800 pounds per square inch for approximately 30 minutes. The multilayer printed circuit card assembly 10 is then permitted to cool down slowly while the holding pressure remains fixed. The resultant multilayer printed circuit board assembly 10 possesses good mechanical strength characteristics and favorable electrically conducting characteristics for the signal land 13 to signal land 13 connections between adjacent printed circuit card 10 layers.

If the laminated multilayer printed assembly is not to be exposed to a high temperature environment, then thermoplastic material can be used to form the joint interfaces. Such material will usually cure to room temperature to 180° F.

There are several methods of applying the thin epoxy coating and a monolayer of metal particles to the selected signal areas 13 and pads 14 where the conductive joining is to be effected. Among these methods are (*a*) screen printing, (*b*) photosensitive epoxy, and (*c*) mask spraying.

The screen printing method is conventional and basically consists of selectively depositing a layer of epoxy to the signal areas by forcing the epoxy through openings in a wire screen. After the selected areas have been coated with epoxy, the metal powder particulate is sprinkled over the entire subassembly surface, and a short drying cycle is provided to enable the powder particulate to stick to the epoxy. The loose powder on the uncoated areas of the printed circuit card surface is then removed preferably by brushing or air.

The photosensitive epoxy method involves the use of a differential solubility in a solvent such as methylene chloride between the epoxy areas exposed to ultraviolet light and the unexposed areas. The epoxy mixed with a predetermined amount of photosensitizer and catalyst will become either partially hardened for the negative system or softened for the positive system upon an exposure to light. The procedure for this method begins with a thin coating of photosensitive epoxy deposited on one side of printed circuit card subassemblies 10_a_, 10_b_ and 10_c_. A negative with a desirable pattern is then matched to the subassembly. After an exposure of from 10 to 15 minutes to an ultraviolet source, the subassembly is separated from the negative and heated at approximately 70° C. for a period of approximately 5 minutes. The subassembly is then immersed into a solvent for approximately 10 to 20 seconds depending upon the thickness of the epoxy and until the unexposed epoxy is completely removed. Finally the metal powder particulate is sprinkled over the surface and the subassembly is then moderately heated to approximately 120° C. so that the metal powder sticks to the epoxy.

The mask spraying method involving a thin stainless steel sheet, in which the required signal area pattern has been etched, is utilized as a mask for spraying epoxy onto selected signal areas. This is followed by the usual coating with metal powder particulate in the drying cycle to enable the adherence of the powder to the epoxy, followed by the removal of the loose powder.

A logical way to make a compact multilayer circuit assembly is to decrease the diameter of the holes while keeping the thickness of the multilayer assembly to a minimum. One of the technical difficulties for reducing the hole size is the inability of drilling and plating the through-holes while maintaining a high aspect ratio. For example, in the present state of the art the aspect ratio limit is approximately 4, which means a 0.030 inch diameter hole in a 0.120 inch thick board or alternatively a 0.020 inch diameter hole in a 0.080 inch thick board. A method to increase the aspect ratio beyond the present limitations is to laminate a stack of subassemblies after each printed circuit subassembly layer has been drilled and the through-holes plated. Herein, the diameter of the holes can be as small or smaller than 0.010 inch in a 0.025 inch thick subassembly having an aspect ratio of only 2.5. The assembly of four such subassemblies by the metal powder epoxy technology can produce a multilayer circuit board assembly having an aspect ratio of 10.

While the invention has been particularly shown and described with reference to preferred embodiments thereof, it will be understood by those skilled in the art that various changes in form and details may be made therein without departing from the spirit and scope of the invention.

What is claimed is:

1. A method of electrically joining adjacent metallic elements comprising the steps:

a. applying a thin and uniform coating of epoxy to one surface of a first metallic element,
b. applying a metal powder particulate to the epoxy coating on the first metallic element,
c. moderately heating the coated first metallic element to effect a partial cure of the epoxy,
d. removing excessive metal powder particulate,
e. applying a uniform layer of epoxy coating to the opposing metallic surface of a second metallic element,
f. aligning the opposing metallic elements, and
g. joining the opposing surfaces by an application of heat and pressure.

2. A method of electrically joining adjacent metallic elements as described in claim 1 and further characterized by the step of permitting the joined elements to cool under an application of pressure.

3. A method of electrically joining adjacent metallic elements as defined in claim 1 wherein the metal powder particulate applied to the first metallic element is uniformly spherical and equal sized.

4. A method of electrically joining adjacent metallic elements as defined in claim 1 wherein the partial curing of step (_c_) is effected at a temperature in a range of 180° to 250° F.

5. A method of electrically joining adjacent metallic elements as defined in claim 1 and wherein the joining effected in step (_g_) is by an application of heat in the range of 200° to 360° F. and a pressure in the range of 100 to 800 pounds per square inch.

6. A method of electrically joining adjacent metallic elements as defined in claim 1 wherein a multilayer assembly having a high aspect ratio can be fabricated through a stacking of metallic element subassemblies.

7. A method of physically and electrically conductively joining juxtapositioned metallic elements attached to dielectric substrate members comprising:

a. applying a thin and uniform layer of epoxy to one of the metallic surfaces attached to a dielectric substrate,
b. applying a metal powder particulate to the epoxy layer,
c. partially curing the epoxied layer,
d. removing excessive metal powder particulate,
e. applying a uniform layer of epoxy to the metallic surface of the opposing dielectric substrate,
f. aligning and assembling the dielectric substrates in juxtaposition, and
g. finally joining the assemblies by an application of heat and pressure.

8. A method of physically and electrically conductively joining juxtapositioned metallic elements attached to dielectric substrate members as defined in claim 7 wherein the metal powder particulate is uniformly spherical and equal sized.

9. A method of physically and electrically conductively joining juxtapositioned metallic elements attached to dielectric substrate members as defined in claim 7 wherein the partial curing of step 3 is effected at a temperature in a range of 180° to 250° F.

10. A method of physically and electrically conductively joining juxtapositioned metallic elements attached to dielectric substrate members as defined in claim 7 wherein the final joining and assembly of step 7 is effected by an application of heat in the range of 200° to 360° F. and a pressure in the range of 100 to 800 pounds per square inch.

11. A method of physically and electrically conductively joining juxtapositioned metallic elements attached to dielectric substrate members as defined in claim 7 further characterized by permitting the assembly to cool while the joining pressure remains applied.

* * * * *